(12) United States Patent
Chang

(10) Patent No.: US 9,437,341 B2
(45) Date of Patent: Sep. 6, 2016

(54) METHOD AND APPARATUS FOR GENERATING HIGH CURRENT NEGATIVE HYDROGEN ION BEAM

(71) Applicant: Varian Semiconductor Equipment Associates, Inc., Gloucester, MA (US)

(72) Inventor: Shengwu Chang, South Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 745 days.

(21) Appl. No.: 13/800,979

(22) Filed: Mar. 13, 2013

(65) Prior Publication Data

US 2013/0255577 A1   Oct. 3, 2013

Related U.S. Application Data

(60) Provisional application No. 61/618,202, filed on Mar. 30, 2012.

(51) Int. Cl.

| | |
|---|---|
| *G21K 5/00* | (2006.01) |
| *H01J 27/02* | (2006.01) |
| *H01J 37/08* | (2006.01) |
| *H01J 37/302* | (2006.01) |
| *H01J 37/317* | (2006.01) |

(52) U.S. Cl.
CPC .............. *G21K 5/00* (2013.01); *H01J 27/028* (2013.01); *H01J 37/08* (2013.01); *H01J 37/302* (2013.01); *H01J 37/3171* (2013.01)

(58) Field of Classification Search
CPC ...... H01J 27/028; H01J 37/08; H01J 37/302; H01J 37/3171; G21K 5/00
See application file for complete search history.

(56) References Cited

U.S. PATENT DOCUMENTS

| | | | | |
|---|---|---|---|---|
| 3,617,789 | A | * 11/1971 | Middleton | G21K 1/14 250/424 |
| 4,447,732 | A | 5/1984 | Leung et al. | |
| 4,559,477 | A | * 12/1985 | Leung | H01J 27/028 250/424 |
| 4,980,556 | A | * 12/1990 | O'Connor | H01J 27/028 250/423 R |

(Continued)

FOREIGN PATENT DOCUMENTS

JP   H07-272654 A   10/1995

OTHER PUBLICATIONS

Philip, S., "Negative Hydrogen and Deuterium Ion Beams," J. Appl. Phys., vol. 31, No. 9, Jan. 1, 1960.*

(Continued)

*Primary Examiner* — Wyatt Stoffa

(57) ABSTRACT

An apparatus to generate negative hydrogen ions includes an ion source operative to generate positive hydrogen ions, a first component to adjust positive molecular hydrogen ion species in the ion source, a second component to adjust extraction voltage for extraction of the positive molecular hydrogen ions from the ion source, and a charge exchange cell comprising charge exchange species to convert the extracted positive molecular hydrogen ions to negative hydrogen ions. The adjusted extraction voltage is effective to generate an ion energy to maximize negative ion current yield in the charge exchange cell based upon a product of extraction efficiency of the positive molecular hydrogen ions and a peak in charge exchange efficiency for converting a species of the positive molecular hydrogen ions to negative hydrogen ions through charge exchange between the extracted hydrogen ions and charge exchange species.

26 Claims, 10 Drawing Sheets

(56) References Cited

U.S. PATENT DOCUMENTS

| | | | | |
|---|---|---|---|---|
| 5,106,570 | A * | 4/1992 | Stein | H01J 27/028 376/127 |
| 5,391,962 | A * | 2/1995 | Roberts | H01J 27/20 250/427 |
| 6,809,325 | B2 * | 10/2004 | Dahl | G21K 5/04 250/492.1 |
| 2004/0038505 | A1 * | 2/2004 | Ito | H01J 37/08 438/520 |
| 2004/0251424 | A1 | 12/2004 | Murata et al. | |
| 2006/0011866 | A1 * | 1/2006 | Cho | H01J 37/3171 250/492.21 |
| 2006/0292058 | A1 * | 12/2006 | Reden | B82Y 30/00 423/447.2 |
| 2009/0314952 | A1 * | 12/2009 | Peters | H01J 27/028 250/423 R |

OTHER PUBLICATIONS

Philp, S., "Negative Hydrogen and Deuterium Ion Beams," J. Appl. Phys., vol. 31, No. 9, Jan. 1, 1960.

Chambers, E., "Dissociation of Molecular Hydrogen Ions Enhanced by Ion-Source Operation," Physical Review, col. 139, No. 4A, Aug. 1, 1965.

International Search Report and Written Opinion, mailing Jul. 15, 2013, PCT/US2013/031748 filed Mar. 14, 2013.

* cited by examiner

METHOD AND APPARATUS FOR GENERATING HIGH CURRENT NEGATIVE HYDROGEN ION BEAM

RELATED APPLICATIONS

This application claims priority to the commonly-owned provisional patent application U.S. Ser. No. 61/618,202 filed Mar. 30, 2012, and entitled "Method and Apparatus for generating high current negative hydrogen ion beam."

FIELD

Embodiments of the invention relate to the field of ion implantation for forming semiconductor structures. More particularly, the present invention relates to a method for producing a hydrogen beam for proton ion implantation.

BACKGROUND

Ion implanters are widely used in device fabrication, including semiconductor manufacturing to control device properties. In a typical ion implanter, ions generated from an ion source are directed as an ion beam through a series of beam-line components that may include one or more analyzing magnets and a plurality of electrodes that provide electric fields to tailor the ion beam properties. The analyzing magnets select desired ion species, filter out contaminant species and ions having undesirable energies, and adjust ion beam quality at a target wafer. Suitably shaped electrodes may modify the energy and the shape of an ion beam.

For high energy implantation, typically 300 kV or greater, tandem acceleration is often used to generate ions of the required energy. Often tandem acceleration is applied to ions such as hydrogen ions in order to generate sufficiently high energy for ions to implant to a desired depth into a substrate. In a tandem acceleration process, an electrostatic accelerator accelerates negative hydrogen ions generated in a special ion source from ground potential up to a positive high-voltage terminal. The electrons on the negative hydrogen ions are then stripped from the negative ion by passage through a charge exchange region, and resulting positive hydrogen ion (proton) is again accelerated as it passes to ground potential from the high negative potential. The protons emerge from the tandem accelerator with twice the energy of the high positive voltage applied to the tandem accelerator.

One problem encountered when producing high energy hydrogen ion beams for ion implantation is the relatively low ion current, which may limit throughput of substrates to be implanted with high energy hydrogen. For example, in commercial power device fabrication it may be desirable to implant hydrogen at ion energies of up to 1.5 MeV and currents of 0.25 mA or higher, which is difficult to obtain using conventional ion implanters. In view of the above, it will be apparent that improvements in high energy proton beam current are needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, an apparatus to generate negative hydrogen ions includes an ion source operative to generate positive hydrogen ions, a first component operative to adjust positive molecular hydrogen ion species in the ion source, a second component operative to adjust extraction voltage for extraction of the positive molecular hydrogen ions from the ion source, and a charge exchange cell comprising charge exchange species to convert the extracted positive molecular hydrogen ions to negative hydrogen ions. The adjusted extraction voltage is effective to generate an ion energy to maximize negative ion current yield in the charge exchange cell based upon a product of extraction efficiency of the positive molecular hydrogen ions and a peak in charge exchange efficiency for converting a species of the positive molecular hydrogen ions to negative hydrogen ions through charge exchange between the extracted hydrogen ions and charge exchange species.

In a further embodiment, a method for providing a negative hydrogen ion beam includes generating positive molecular hydrogen ions in an ion source, providing a charge exchange species in a charge exchange cell, where the charge exchange species are operative to transform the positive hydrogen ions into negative hydrogen ions. The method further includes extracting the positive hydrogen molecular ions at an extraction voltage effective to maximize negative ion current yield in the charge exchange cell based upon a product of extraction efficiency of the positive molecular hydrogen ions and charge exchange efficiency for converting a species of the positive molecular hydrogen ions to negative hydrogen ions through charge exchange between the extracted hydrogen ions and charge exchange species.

DETAILED DESCRIPTION

Embodiments disclosed herein provide improved negative hydrogen ion current sources and high efficiency techniques for generating negative hydrogen ions. In various embodiments, a high energy proton (hydrogen) ion implantation system may employ a high negative hydrogen ion current generating module (generator) that provides a higher hydrogen ion current at ion energies in excess of 300 kV as compared to conventional ion implantation systems.

Magnesium-based charge exchangers have been used in ion implantation apparatus to generate negative hydrogen ions using a charge exchange process in which magnesium donates electrons to positive hydrogen ions to form negative hydrogen ions. The negative ions may then be transported to a tandem accelerator apparatus that accelerates the negative ions to high energy as described above. Although prior research has shown that other elements such as Cesium and barium may produce higher yields of negative ions than magnesium under various conditions, processing and cost of magnesium render magnesium charge exchangers as attractive for applications such as ion implantation. However, an ongoing challenge for high energy implantation of hydrogen ions for device manufacturing is the need to provide high current in order to reduce costs and increase throughput of work piece to be implanted with high energy protons. Therefore, the ability to obtain improved negative hydrogen ion production using magnesium charge exchange process was studied.

As detailed below, methods and apparatus for producing increased negative hydrogen ion current are set forth. In particular, the increased negative hydrogen ion current may be achieved by tuning the extraction energy used to extract positive hydrogen ions from an ion source and by adjusting the type of hydrogen ions created in the ion source, that is, the relative fraction of hydrogen ions such as H+, H2+, or H3+. In various embodiments, the extraction energy is adjusted based upon a peak in charge exchange resonance for converting the positive hydrogen ions to negative hydrogen ions through charge exchange between the extracted hydrogen ions and charge exchange species in a charge exchange cell.

Figure 1:
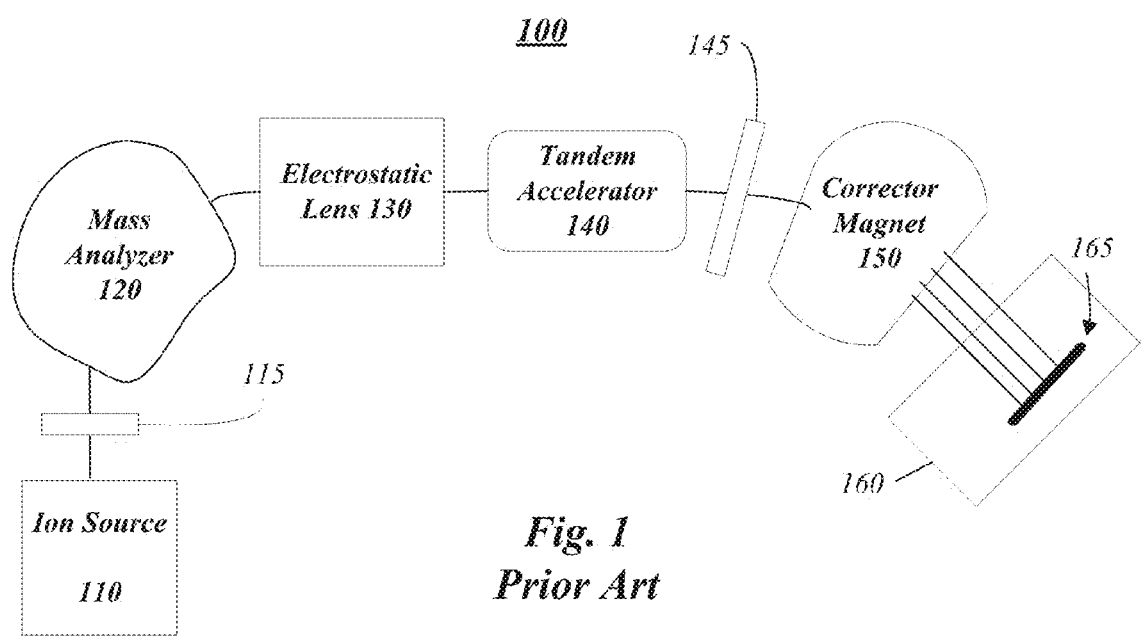
FIG. 1 is a functional block diagram of a conventional ion implanter.

For purposes of illustration, FIG. 1 depicts a conventional ion implanter (also termed "ion implantation system") 100 that may be used for high energy implantation. The ion implanter 100 includes an ion source 110 that generates an ion beam (not shown) and a charge exchange cell 115, which may convert positive ions emerging from the ion source 110 into negative ions. The ion implanter further includes a mass analyzer 120 that deflects and filters the ion beam to produce ions of a desired mass, a quadrupole lens 130, tandem accelerator 140, scanner 145, corrector magnet 150, stage or end station 160, and substrate platen 165.

The ion implanter 100 may employ the tandem accelerator 140 to increase the energy level of ions to a desired energy level. In particular, tandem accelerator 140 receives a low energy ion beam with energy on the order of a several tens of keV (thousand electron volts) and accelerates the ion beam to energies in the range of several hundred to several thousand keV. An exemplary tandem accelerator (e.g. 140) may include a low energy accelerator tube, a terminal, and a high energy accelerator tube. The accelerator tubes contain a number of accelerator electrodes separated by insulating rings. A high positive voltage is applied by a high voltage supply to the terminal and thereby to the highest voltage electrodes of the low energy and high energy accelerator tubes. Adjacent accelerator electrodes are interconnected by high value resistors which distribute the applied voltage among the accelerator electrodes. The terminal between the first and second accelerator tubes contains a gas-filled stripper tube which converts ions in the beam from a negative charge to a positive charge. As noted, in a normal high energy mode, a negative ion beam is injected into the tandem accelerator, accelerated through the low energy accelerator tube to the terminal, converted to a positive beam, and then is accelerated further in the high energy accelerator tube toward a potential that may be at ground.

Figure 2:
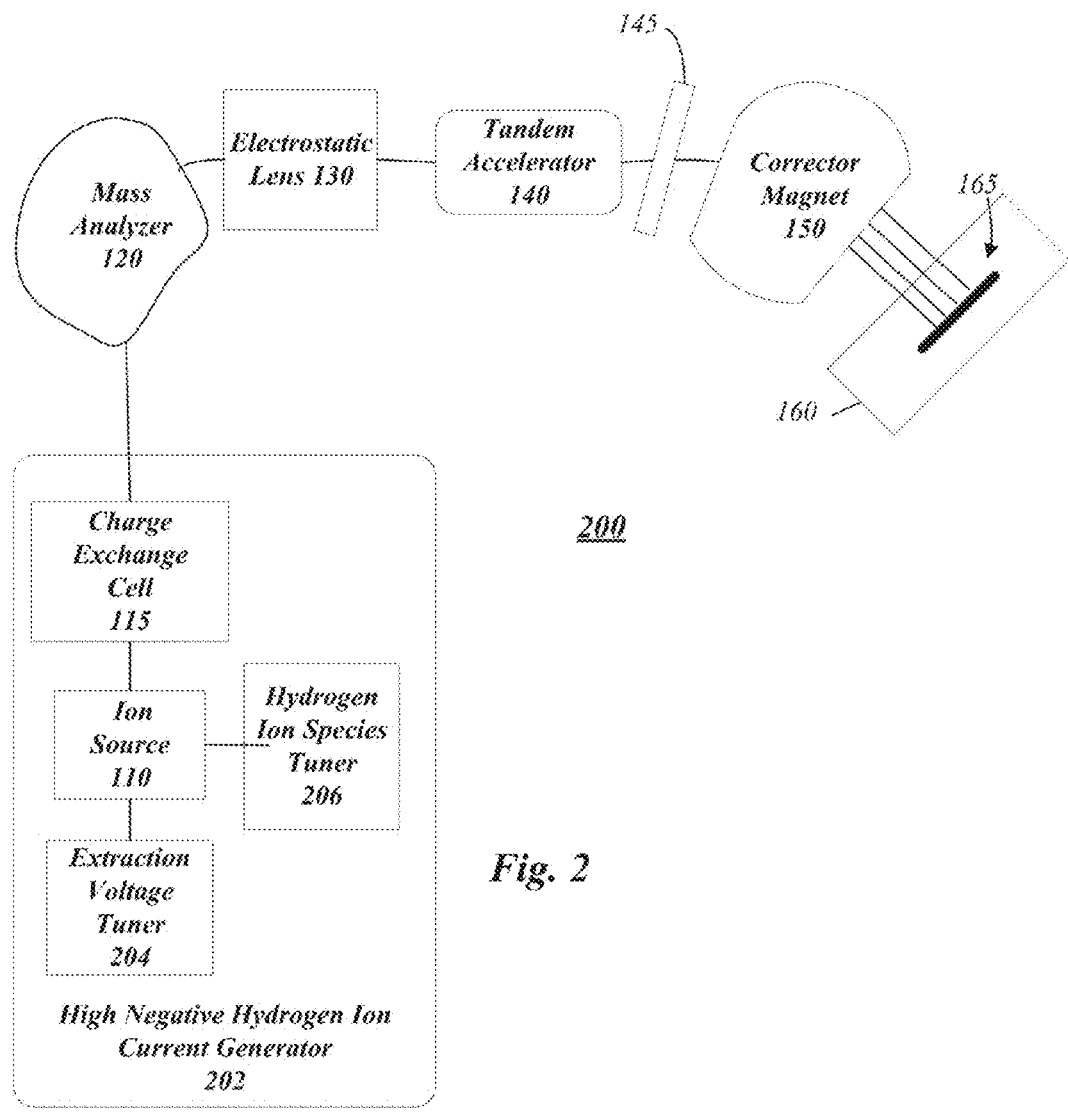
FIG. 2 is a functional block diagram of an ion implanter consistent with the present embodiments.

FIG. 2 depicts an exemplary ion implantation system 200 consistent with the present embodiments. The ion implantation system 200 includes beamline components that are the same as those illustrated in the known ion implanter 100 shown in FIG. 1, except as noted herein. In particular, the ion implantation system 200 includes an apparatus for generating negative hydrogen ions, the high negative hydrogen ion current generator 202. The high negative ion current generator 202 includes an ion source 110 and charge exchange cell 115. The charge exchange cell 115 may operate generally according to known exchange cell operation in which a fraction of incoming positive hydrogen ions are converted to negative hydrogen ions. The ion implantation system 200 includes additional components that enhance the yield of negative ions produced by the charge exchange cell 115. These components operate to increase the amount of molecular hydrogen ions such as H3+ and H2+ and to adjust the extraction voltage applied to the ion source 110 to optimize a combination of positive ion current extracted from the ion source 110 and charge exchange efficiency for generating negative ions in the charge exchange cell 115. In the example shown in FIG. 2, the components include an extraction voltage tuner 204, and hydrogen ion species tuner 206.

In the present embodiments, during operation of the high negative hydrogen ion current generator 202, hydrogen gas is admitted into the ion source 110, and a plasma discharge containing hydrogen ions is ignited. The high negative hydrogen ion current generator 202 also includes the hydrogen ion species tuner 206 that may be used to adjust the fraction of molecular hydrogen ions in the ion source 110. The hydrogen ions species tuner may include various controls (not explicitly shown) that allow a user to adjust gas flow and/or plasma energy and/or magnetic field and/or electric field in the ions source 110 to increase molecular hydrogen ion yield in the ion source 110. The extraction voltage tuner 204 is operable to adjust the extraction voltage of hydrogen ions to provide positive hydrogen ions of optimal energy ranges to the charge exchange cell 115. The extraction voltage tuner 204 may include digital logic, memory, and/or a user interface (not explicitly shown) that facilitate manual or automatic setting of an optimal extraction voltage for ion source 110 based upon the amount of molecular hydrogen ions produced by the ion source 110, the charge exchange species in the charge exchange cell 115 and other factors.

The present inventors have discovered novel combinations of ion energy and hydrogen species to create positive hydrogen ions that yield higher currents of negative hydrogen ions when introduced into a charge exchange cell to produce negative ions. In various embodiments the charge exchange cell 115 may be a magnesium-based charge exchange cell, a cesium based charge exchange cell, an NH3 based charge exchange cell, a Xe based charge exchange cell or an H2O based change exchange cell. The embodiments are not limited in this context. The combination of hydrogen ion species and ion energy for positive ions introduced into a charge exchange cell potentially substantially increases negative hydrogen ion currents in an ion implantation apparatus, such as ion implantation system 200, thereby producing higher proton currents at a substrate after the negative ions are accelerated through the tandem accelerator 140.

In the embodiments discussed below, apparatus and methods are disclosed that adjust extraction voltage of an ion source to generate an ion energy for positive molecular hydrogen ions of a given species that maximizes negative ion current yield in a charge exchange cell. The species may be, for example, H2+, or H3+ each of which has a different characteristic peak energy for resonant charge exchange with a charge exchange species, such as Mg. In particular, the negative ion current yield in the charge exchange cell is maximized based upon a product of extraction efficiency of the positive molecular hydrogen ions and a peak in charge exchange efficiency for converting a species of the positive molecular hydrogen ions to negative hydrogen ions through charge exchange between the extracted hydrogen ions and charge exchange species.

In some specific embodiments, by setting the ion source extraction voltage to produce an ion energy approximately equal to a peak energy for resonant charge exchange, the total amount of negative hydrogen ion current produced in a charge exchange cell may be optimized. The term "approximately equal to" as used herein with respect to ion energy denotes an energy range of +/−30% with respect to the peak energy for resonant charge exchange for a given positive hydrogen ion species. Thus, for example, the H3+ positive hydrogen ion species exhibits a peak energy for resonant charge exchange with Mg at about 22.5 keV. An energy that is approximately equal to this peak energy therefore may fall within the range of 22.5 keV+/−33%, or about 15-30 keV. Likewise, the H2+ positive hydrogen ion species exhibits a peak energy for resonant charge exchange with Mg at about 15 keV. An energy that is approximately equal to this peak energy therefore may fall within the range of 15 keV+/−30%, or about 10-20 keV; and so forth. Likewise, for the H+ positive hydrogen ion species that has a peak energy for resonant charge exchange with Mg of about 7.5 keV, an energy between 5 and 10 k eV is "approximately equal to" the resonant charge exchange energy for H+ positive hydrogen ion species interaction with Mg.

In particular, the present inventors have identified different mechanism for formation of negative hydrogen ions by charge exchange with magnesium as set forth below.

Four possible channels exist for H3+ to become H−:

1)

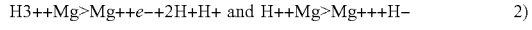
2)

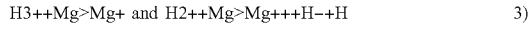
3)

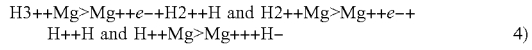
4)

Two possible channels exist for H2+ to become H−:

1)

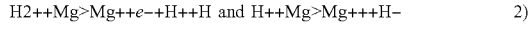
2)

Only one possible channel exists for H+ to become H−:

Figure 3A:
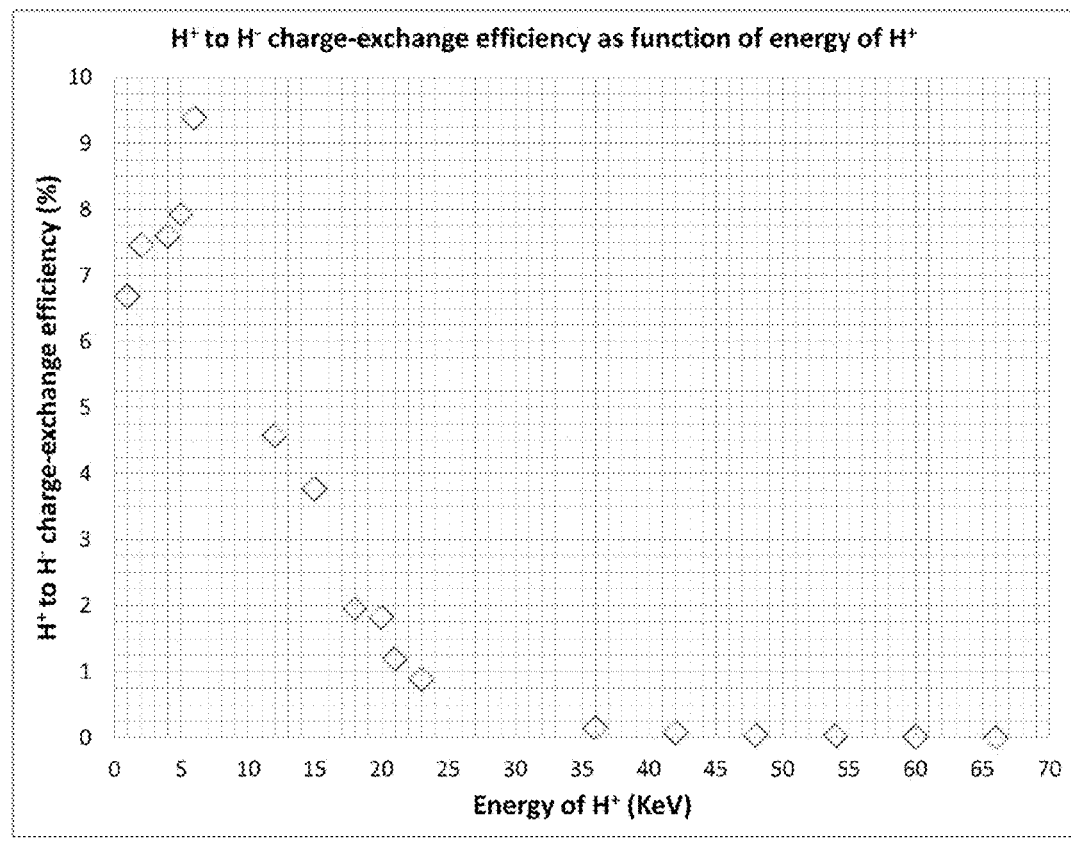
FIG. 3A is graph of experimental data showing H+ to H– charge exchange efficiency as a function of H+ ion energy.

In particular, a peak in the charge exchange process between positive hydrogen ions (H+) and magnesium has been identified at an ion energy of about 6 to 8 keV, with an estimation of about 7.5 keV at the peak energy. FIG. 3A illustrates experimental data showing H+ to H− charge exchange efficiency as a function of H+ ion energy. The charge exchange efficiency represents the fraction (in percentage) of H+ ions as a function of energy of H+ ions that are converted to H− ions when encountering the magnesium charge exchange cell. Turing once more to FIG. 2, the charge exchange efficiency shown in FIG. 3 is indicative of the yield (current) of negative hydrogen ions that can be produced by the charge exchange cell 115 for a given current of H+ ions produced by the ion source 110. In the range of H+ ion energy shown in FIG. 3A, the charge exchange efficiency (ECE) reaches a peak of about 11% in the energy range between 7 and 8 keV. This peak charge exchange efficiency contrasts with a charge exchange efficiency of about five percent at 1 kV H+ ion energy and an ECE of only about 2% at 20 kV H+ ion energy. As illustrated in the FIG. 3, ECE decreases monotonically to about zero at 35 keV and greater ion energies.

According to the results of FIG. 3A, it may be desirable to extract ions from a positive hydrogen ion source that generates H+ ions at a voltage of between 5 and 10 KeV in order to maximize the percentage of H+ ions that are converted into H− ions. However, although the charge exchange efficiency for creating negative hydrogen ions by interaction with Mg exhibits a peak in the range between 7 and 8 keV, the current density of negative ions created in a negative ion current generator comprising an ion source and charge exchange chamber depends upon multiple factors. In addition to the efficiency or probability of creating a negative hydrogen ion through interaction of positive hydrogen ions with magnesium in a charge exchange chamber, the total positive hydrogen ion current incident on the charge exchange chamber helps determine the negative hydrogen ion current of an ion beam that exits the charge exchange chamber. The flux of positive ions in an ion beam incident on the charge exchange chamber may be directly proportional and in some cases approximately equal to the ion beam current of positive hydrogen ions extracted from the ion source.

In many ion sources, the ion beam current that can be extracted from an ion source scales upwardly with extraction voltage. The ion beam current (I+) of positive hydrogen ions that can be extracted from a typical ion source at 7 kV, for example, is substantially less than the ion beam current of positive hydrogen ions that can be extracted at 20 kV, for example, due to the ion beam perveance limiting effects. Therefore, the gain in charge exchange efficiency observed at H+ ion energies in the range of between 7 and 8 keV (11%) as compared to energies of 20-30 keV (1%) may be at least partially offset by the lesser I+ that can be extracted from the ion source and provided to the charge exchange cell at extraction voltages of between 7 and 8 keV as compared to extraction at 20-30 kV.

Therefore, in principle, the ion source extraction voltage may be optimized to balance the increased ECE in the peak charge exchange efficiency range of 7.5 keV with the increased ion beam current from the ion source at higher energies. In one example, the beam current of hydrogen ions I+ that can be extracted from the ion source may vary as V3/2 where V is the extraction voltage, which may be equated to the ion energy of H+ ions (protons) extracted from the ion source and incident on the charge exchange chamber. Accordingly, in principle, the extraction voltage tuner may adjust the extraction voltage such that the product of the charge exchange efficiency and the H+ (proton) current received by the charge exchange chamber is a maximum.

Figure 4:
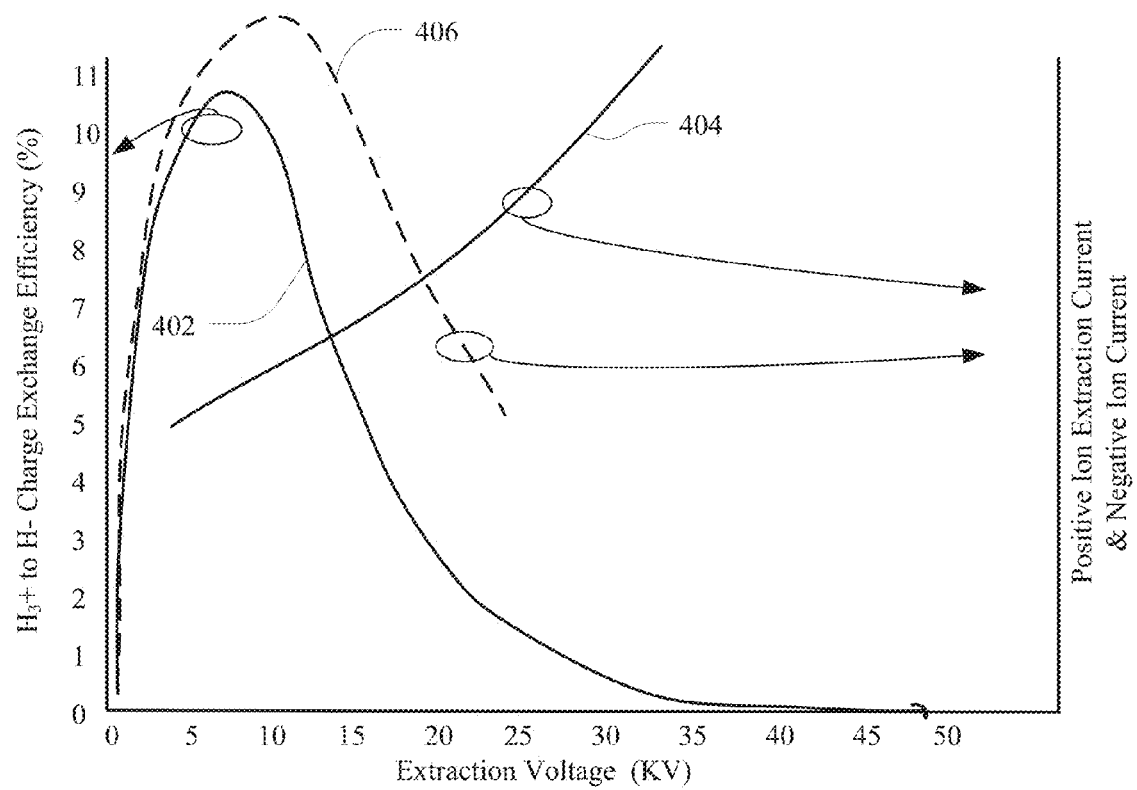
FIG. 4 is a graph showing behavior of H– yield for the H+/Mg system.
Figure 5:
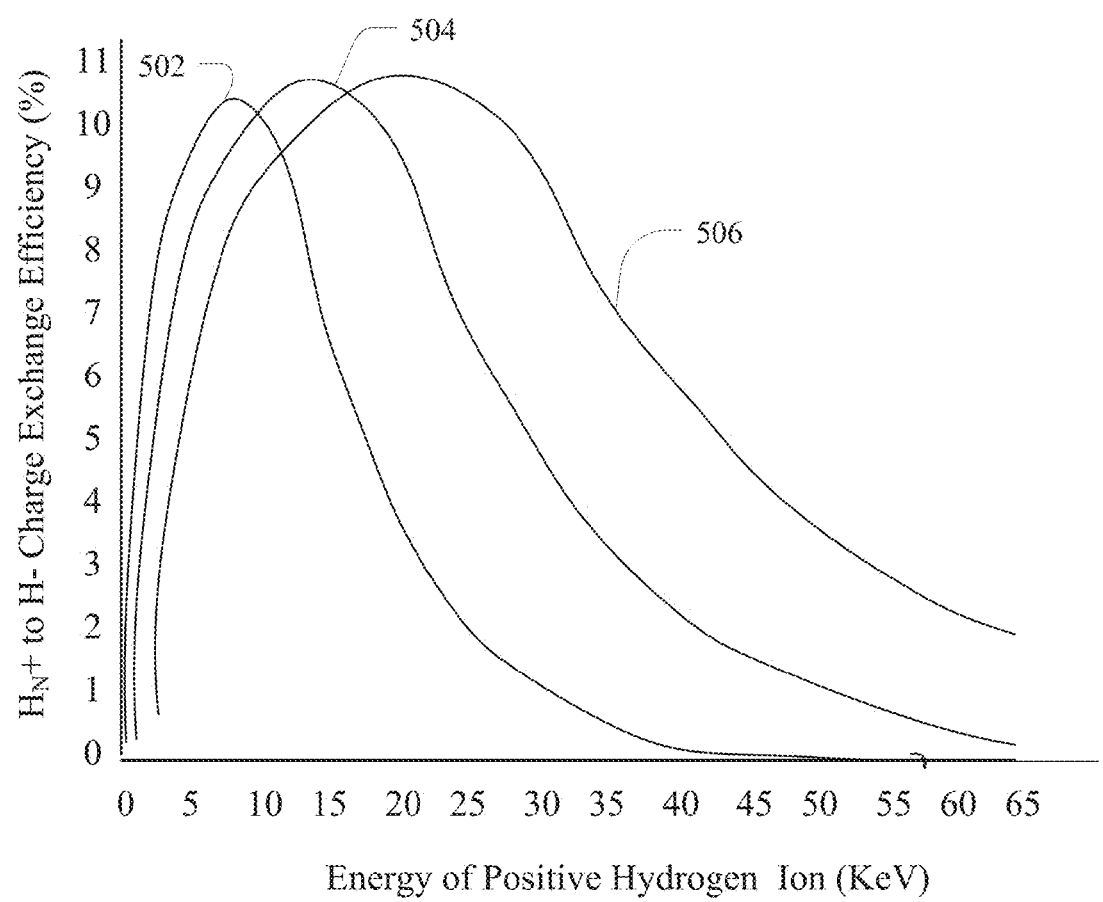
FIG. 5 is a graph generally illustrating positive-ion-to H– charge exchange efficiency as a function of ion energy for different positively charged hydrogen species.

FIG. 4 illustrates optimization of H− yield for the H+/Mg system consistent with various embodiments. In particular FIG. 4 includes a curve 402 that represents the experimental data from FIG. 3A showing H+ to H− charge exchange efficiency as a function of H+ ion energy (shown as extraction voltage). In addition, a curve 404 is shown that delineates in a qualitative fashion the extraction efficiency for positive hydrogen ion current that can be extracted from an ion source as a function of extraction voltage. Also illustrated in FIG. 4 is a curve 406, which depicts qualitatively the negative ion current that may be generated in a charge exchange cell for the H+/Mg system. The negative ion current is proportional to a product of ECE (curve 402) and the positive ion extraction efficiency (curve 404). As suggested by FIG. 4, the negative ion current, curve 406, exhibits a peak and decreases at higher extraction voltages due to the rapid decrease in ECE above about 10 keV. The peak in negative ion current thus represents an optimization of the product of charge exchange efficiency and positive ion extraction current. The position of the peak in curve 406 thus represents a tradeoff at voltages above about 8 keV between increasing amounts of positive hydrogen ion current provided to a charge exchange cell and decreasing charge exchange efficiency that occurs in the charge exchange cell when H+ ions interact with magnesium. For example, a peak in negative ion current for H+ ions may occur at about 10 KV extraction voltage from an ion source.

It is to be noted that the total negative ion current even at the voltage peak for the H+/Mg system may be undesirably low due to the relatively low H+ current that can be extracted at about 8-10 kV. However, as shown in FIG. 4 at ion energies in the range of 20-40 keV, for example, which correspond to voltages in which positive ion beam current I+ extracted from an ion source is much higher, the value of ECE in the H+/Mg is too low, resulting in lower total negative ion current produced in an exchange cell.

In various embodiments the above tradeoffs for the H+/Mg system between peaked ECE observed in the 7 to 8 keV range and increased positive ion beam current I+ at higher energies, such as ion energies in the range of 20-30 keV, is circumvented. In particular, instead of creating a plasma of protons in an ion source, the hydrogen ion species tuner 206 may increase the fraction of molecular hydrogen ions in the ion source 110.

Figure 3B:
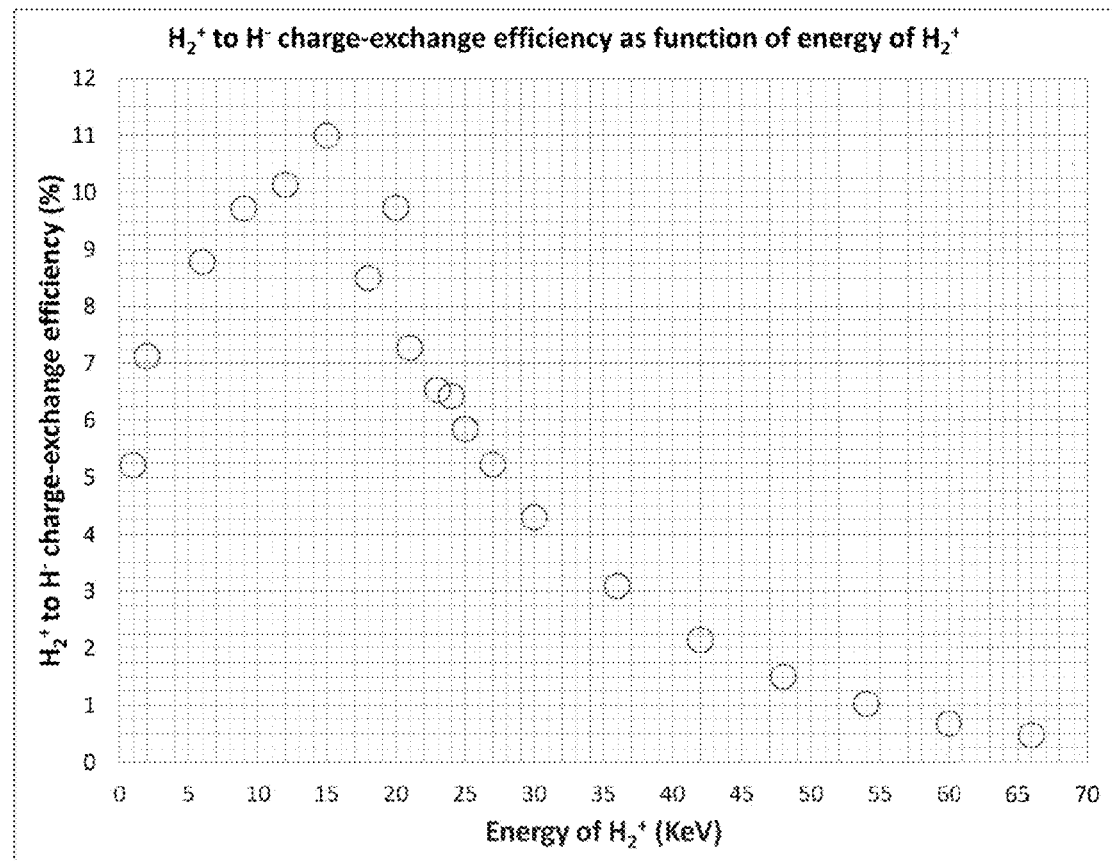
FIG. 3B is graph of experimental data showing H2+ to H– charge exchange efficiency as a function of H2+ ion energy.
Figure 3C:
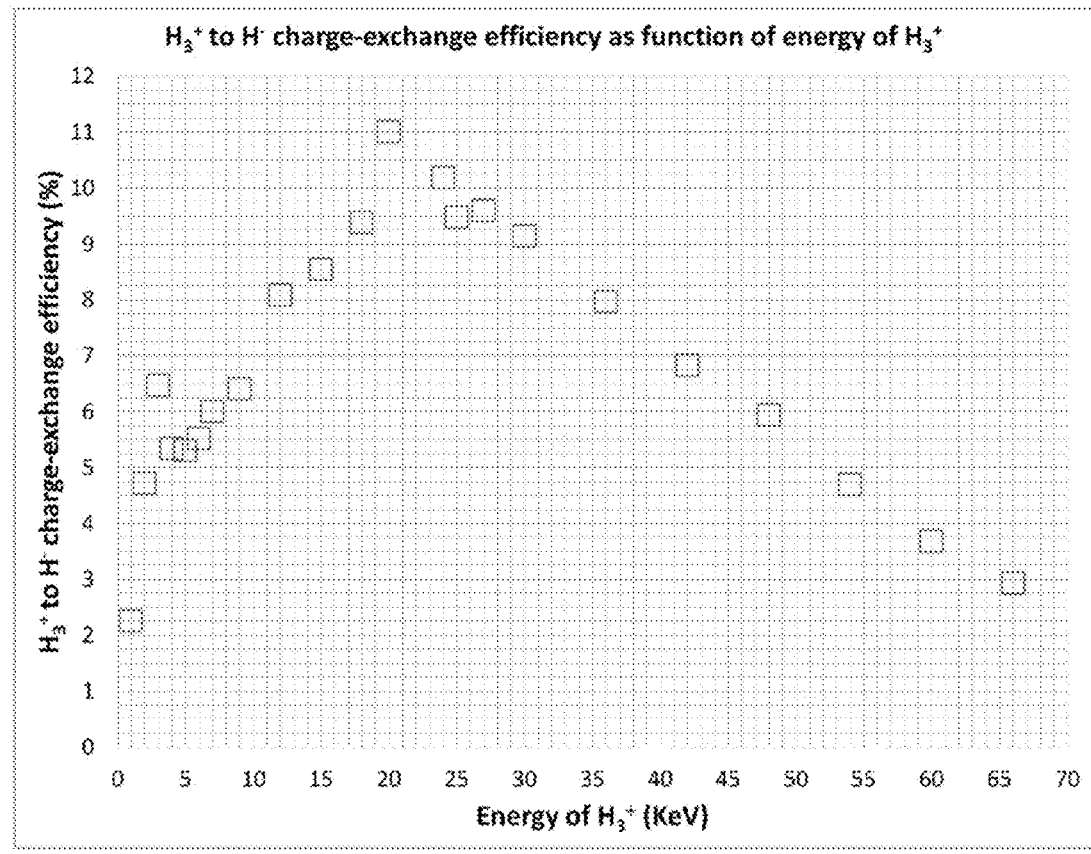
FIG. 3C is graph of experimental data showing H3+ to H– charge exchange efficiency as a function of H3+ ion energy.
Figure 3D:
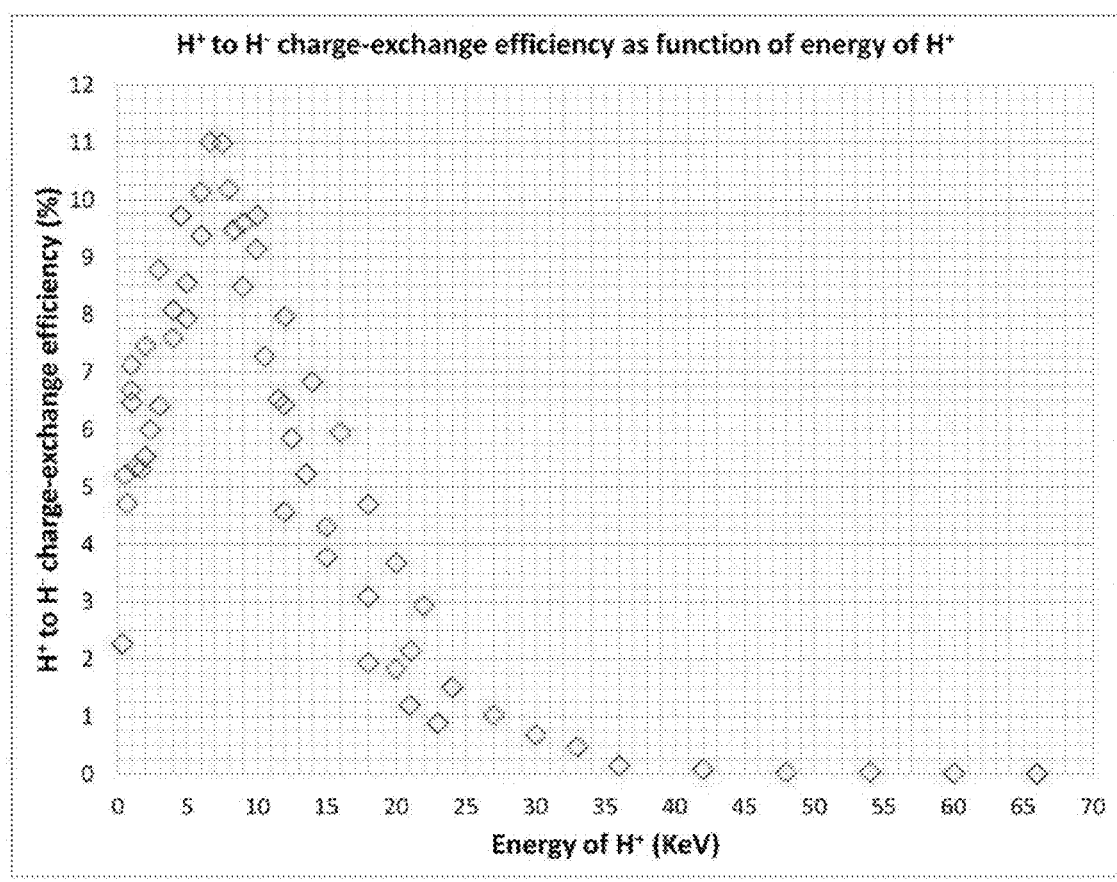
FIG. 3D is graph of experimental data showing HN+ to H– charge exchange efficiency as a function of HN+ ion energy/N.

In light of the peak in charge exchange resonance for H2+ to H− charge exchange at about 7.5 keV shown in FIG. 3A, measurements of charge exchange resonance for positive molecular hydrogen ions have been conducted. FIG. 3B presents a graph of experimental data showing H2+ to H− charge exchange efficiency as a function of H2+ ion energy, while FIG. 3C presents a graph of experimental data showing H3+ to H− charge exchange efficiency as a function of H3+ ion energy. As shown in FIGS. 3B and 3C, a peak in charge exchange resonance occurs at about 15 keV, and 22.5 keV, respectively. Moreover, the value of charge exchange efficiency for both H3+ to H− and H2+ to H− (11%) is very similar to the value measured for H−+ to H− (10%). This behavior can be understood by reference to FIG. 3D which is a graph of experimental data showing HN+ to H− charge exchange efficiency as a function of HN+ ion energy/N, which is termed herein "normalized hydrogen ion energy." Thus, in FIG. 3D the energy for a given HN+ species is normalized to the number of H atoms in the given positive hydrogen ion. As can be seen, the peak in charge exchange resonance occurs at a normalized hydrogen ion energy of about 7.5 keV for all positive hydrogen ion types.

In accordance with one embodiment, a method for generating a negative hydrogen ion beam entails creating molecular hydrogen ions in an ion source, and extracting the ions at an extraction voltage to impart a predetermined ion energy, the predetermined ion energy comprising an energy that is operable to impart into each proton of the molecular hydrogen ion an energy equivalent to the peak in energy for resonant charge exchange of protons with magnesium. The method may also entail introducing the molecular hydrogen ions having the predetermined energy into a charge exchange cell containing magnesium species.

As detailed below, embodiments that employ molecular hydrogen for generating negative ions take advantage of the fact that the charge exchange peak occurs at much higher voltages than for H+ where positive ion current is more readily extracted, that is, where the extraction efficiency of positive ions increases. Accordingly, negative ion current generated in a charge exchange cell from interaction of positive molecular hydrogen with charge exchange species may be maximized based upon choosing an extraction voltage that produces a target ion energy where a product of the charge exchange efficiency for a given positive molecular hydrogen ion and the extraction efficiency of the given positive molecular hydrogen ion, is maximized. Because the peak energy for resonant charge exchange is much higher for positive molecular hydrogen ions that for monatomic hydrogen, this product value may be much higher than for monatomic hydrogen, since the extraction efficiency of positive ions increases with increased ion energy (voltage) as shown by curve 404.

In one exemplary implementation, the fraction of H3+ ions may be increased by adjusting the gas flow to the ion source 110 and/or by adjusting the magnetic and/or electric field applied to the ion source 110. In particular, the fraction of H3+ ions may be increased by increasing gas flow to the ion source 110. For ion sources that generate a substantial fraction of H3+ ions the extraction voltage for the ion source may be increased to take advantage of the higher voltage associated with the peak in ECE occurs at a higher voltage than for H+ ions.

Based upon the experimental data of FIGS. 3A-3D, FIG. 5 compares ECE for H+, H2+, and H3+ ions for charge exchange in a magnesium cell, in this case as a function of non-normalized ion energy. The curve 502 is similar to curve 402 for H+ discussed above with respect to FIG. 4. As shown, the value of ECE in the 20 KeV to 25 keV range is very low, below 2%. In contrast the curves 504 and 506, which represent ECE values for H2+ and H3+ ions, exhibit much higher values of ECE in this voltage range. For example, the curve 504 for H2+ ions shows a peak in ECE at about 15 keV and that ECE is in the range of about 5-9% between 20 keV to 25 keV. The curve 506 for H3+ ions shows a peak at about 22.5 keV and that ECE is in the range of about 10+/−1% between 20 keV to 25 keV. These results can be explained by consideration of the charge exchange process for forming negative hydrogen ions. The charge exchange process depends in particular upon the velocity of the positive hydrogen ion in the presence of magnesium. At an ideal velocity corresponding to about 7.5 keV for protons, the charge exchange process is most efficient for forming negative ions in the magnesium exchange cell. This same velocity, however, is also carried by an H2+ ion having 15 keV energy, since $V=\sqrt{(energy/m)/2}$. Accordingly doubling in mass of a hydrogen ion results in doubling of energy to obtain the same velocity. Similarly, an H3+ ion having 22.5 keV energy exhibits the same velocity as a proton having 7.5 KeV energy. Accordingly, the charge exchange peak in the molecular hydrogen species H2+ and H3+ shown in FIG. 5 occurs at the kinetic energies of 15 and 22.5 keV, respectively, since those energies impart the ideal velocity for resonant charge exchange.

Thus, for example, when ion source 110 generates H3+ ions, the extraction voltage may be increased to a level in the range of three times the voltage corresponding to the peak in ECE for H+ ions and magnesium, that is, about 22.5 keV. In various embodiments, this extraction voltage may be set between 15-30 kV to generate ion energy approximately that of the peak energy at 22.5 keV, that is, an energy within the range of 15-30 keV. In some embodiments, the extraction voltage may be set between 20-40 kV.

As noted, a benefit of this embodiment is that the voltage applied to extract ions from the ion source is much higher than in the case of atomic hydrogen ions (protons) (e.g., 22.5 kV instead of 7.5 kV), which may yield much larger I+ than in the case of extracting atomic hydrogen ions (H+) at the voltage characteristic of the peak in ECE (7.5 kV).

Figure 6:
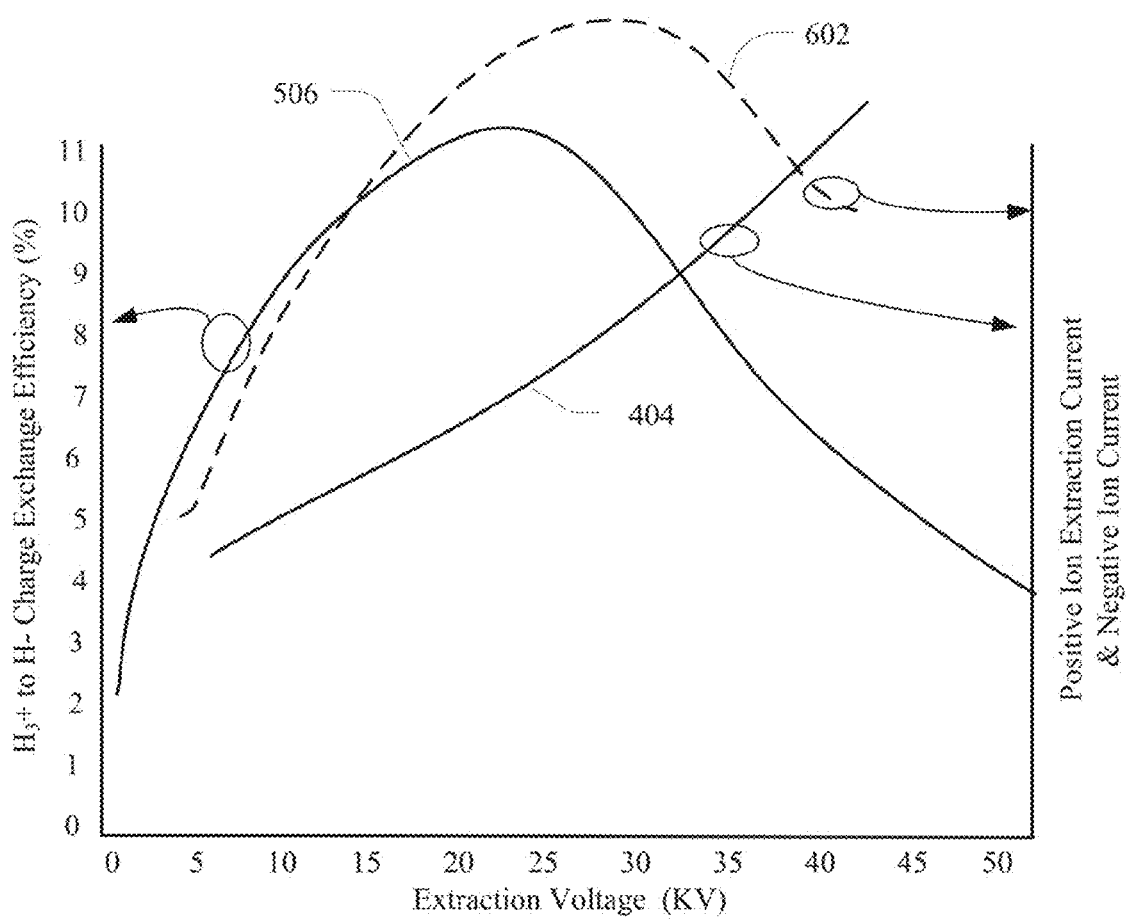
FIG. 6 is a graph showing optimization of H– yield consistent with various embodiments.

FIG. 6 illustrates optimization of H− yield for the H3+/Mg system consistent with various embodiments. In particular FIG. 6 includes a curve 506 that represents the H+ to H− charge exchange efficiency as a function of H3+ ion energy and is reproduced from FIG. 5. In addition, a curve 404 is reproduced from FIG. 4 that delineates in a qualitative fashion the extraction efficiency for positive hydrogen ion current variation with extraction voltage. Also illustrated in FIG. 6 is a curve 602, which depicts qualitatively the negative ion current that may be generated in a charge exchange cell for the H3+/Mg system. The negative ion current is proportional to a product of ECE (curve 506) and the positive ion extraction (curve 404). As suggested by FIG. 6, the negative ion current, curve 602, exhibits a peak and decreases at higher extraction voltages due to the rapid decrease in ECE above about 25 KeV. However, in contrast to the case for H+/Mg system where the negative ion peak occurs at about 10 KeV, the peak in negative ion current for the H3+/Mg system occurs at a much higher extraction voltage (25-30 kV) where positive ion current delivered to the charge exchange cell 115 is much higher. Although the quantitative value of negative ion current is not shown, the peak in curve 602 represents a much higher value as compared to the peak in curve 406 shown in FIG. 4. Accordingly, when ion source conditions such as gas flow, magnetic and electric field are adjusted by hydrogen ion species tuner 206 to produce the H3+ ions the extraction voltage of ion source 110 may be set to around 25-30 kV by extraction voltage tuner 204 to maximize negative ion current in charge exchange cell 115.

Another advantage of providing H3+ ions at 22.5 kV ion energy to create negative hydrogen ions is that the cross section for resonant charge exchange of positive hydrogen ions with magnesium is higher than for protons. Thus, in addition to imparting an optimum energy to protons for resonant charge exchange to create negative hydrogen ions, the greater resonant charge exchange cross section of H3+ ions further enhances the probability of creating negative hydrogen ions.

In other embodiments, instead of using H3+ ions to create negative hydrogen ions, H2+ ions may be used. For example, following the above approach H2+ ions may be extracted at about 15 kV potential corresponding to the peak in curve 504, so as to impart a velocity to the H2+ ions equivalent to that imparted to the H+ ions at 7.5 kV. In this case, the extraction voltage is lower than for H3+ ions extracted at 22.5 kV. Therefore, the total negative ion current produced by this latter approach may be less than that achieved using H3+ ions extracted at 22.5 kV. However, other experimental parameters may favor use of H2+ ions extracted at about 15 kV, as opposed to H3+ ions extracted at ~22.5 kV. For example, it may be preferable to operate an ion source at a pressure range that generates a greater fraction of H2+ ions because of stability or other factors. In such cases the extraction voltage may be set between 10-20 kV to generate ions within an energy range of 10-20 keV that is approximately that of the peak energy for resonant charge exchange of H2+ ions with Mg.

Figure 7:
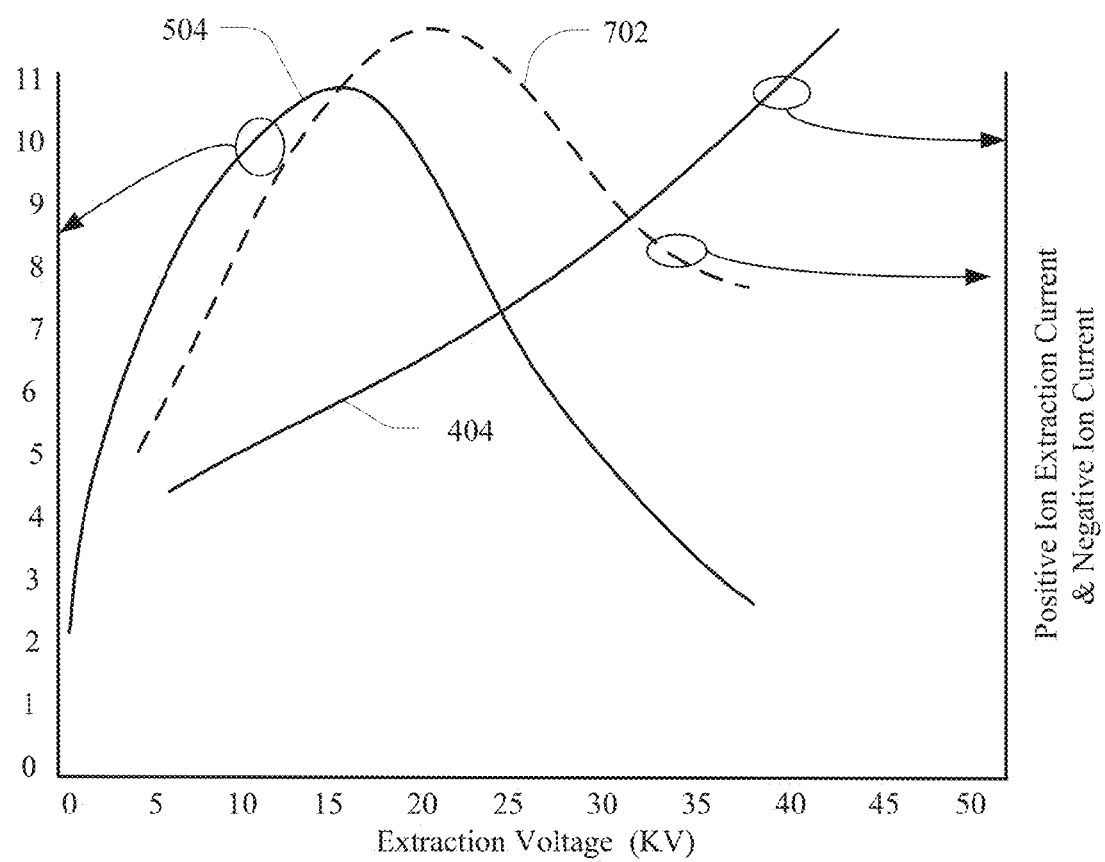
FIG. 7 is a graph showing optimization of H– yield consistent with additional embodiments.

FIG. 7 illustrates optimization of H− yield for the H2+/Mg system consistent with various embodiments. In particular FIG. 7 includes the curve 504 that represents the H+ to H− charge exchange efficiency as a function of H2+ ion energy and is reproduced from FIG. 5. In addition, a curve 404 is reproduced from FIG. 4 that delineates in a qualitative fashion the extraction efficiency for positive hydrogen ion current variation with extraction voltage. Also illustrated in FIG. 7 is a curve 702, which depicts qualitatively the negative ion current that may be generated in a charge exchange cell for the H2+/Mg system. The negative ion current is proportional to a product of ECE (curve 504) and the positive ion extraction (curve 404). As suggested by FIG. 7, the negative ion current, curve 702, exhibits a peak and decreases at higher extraction voltages due to the rapid decrease in ECE above about 15 KeV. However, in contrast to the case for H+/Mg system where the negative ion peak occurs at about 10 KeV, the peak in negative ion current for the H3+/Mg system occurs at a higher extraction voltage (~20 kV) where positive ion current delivered to the charge exchange cell 115 is much higher. Although the quantitative value of negative ion current is not shown, the peak in curve 702 represents a much higher value as compared to the peak in curve 406 shown in FIG. 4. Accordingly, when ion source conditions such as gas flow, magnetic and electric field are adjusted by hydrogen ion species tuner 206 to produce the H2+ ions the extraction voltage of ion source 110 may be set to around 20 kV by extraction voltage tuner 204 to maximize negative ion current in charge exchange cell 115.

In the above examples, the determination of the proper extraction voltage for operation of ion source 110 may be based at least in part upon the relative amount of different hydrogen ions produced in the ion source 110. Thus, in one embodiment if the fraction of H2+ ions to total positive hydrogen ions is above a given threshold (e.g., 50% or any other suitable threshold), the extraction voltage may be set to a voltage in the range of 15-20 kV to harness the H2+ ions for negative hydrogen ion production. Alternatively, in another embodiment if the fraction of H3+ ions to total positive hydrogen ions is below a given threshold (e.g., 50% or any other suitable threshold), the extraction voltage may be set to a voltage in the range of 15-20 kV to harness the H2+ ions for negative hydrogen ion production.

Consistent with the present embodiments, in ion implantation systems such as ion implantation system 200, the use of H3+ ions extracted from an ion source at a voltage of about 20-30 kV may yield a negative hydrogen ion beam current of about one milliamp, for example 0.5 to 1.5 mA, for high energy ions having ion energy of about 300 keV to 3 meV.

Although the aforementioned embodiments detail production of negative hydrogen ions using magnesium exchange cells, in other embodiments other components such as cesium, NH3, Xe or H2O may be used in the exchange cells to generate negative hydrogen ions. In these latter systems the approach generally outlined hereinabove may be used to optimize negative ion current. In particular, a first resonant charge exchange energy may be identified for H+-to H− conversion for any of the aforementioned charge exchange components. A second resonant charge exchange energy may then be employed for an ion source that generates H3+ ions, where the second resonant charge exchange energy represents about three times the value of the first resonant charge exchange energy. In this manner a higher positive hydrogen ion current can be delivered to the charge exchange cell 115 at velocities of the molecular hydrogen ions where the charge exchange efficiency is peaked, thereby optimizing negative hydrogen ion yield.

In summary, apparatus and methods to produce high negative hydrogen ion current are disclosed. In some embodiments, molecular hydrogen ions are generated and extracted at an extraction voltage operable to impart an energy to each proton in the molecular hydrogen ions that corresponds to a peak energy for charge exchange between protons and magnesium species.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. For example, although the embodiments detailed above describe the production of high negative hydrogen ion current for ion implantation purposes, the present embodiments cover any application where a high current of negative hydrogen ions may be applied.

Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. An apparatus to generate negative hydrogen ions, comprising:
    an ion source operative to generate positive molecular hydrogen ions;
    a first component operative to adjust positive molecular hydrogen ion species in the ion source;
    a charge exchange cell comprising charge exchange species to convert the extracted positive molecular hydrogen ions to negative hydrogen ions, and
    an extraction voltage tuner component comprising logic operative to set an adjusted extraction voltage for extraction of the positive molecular hydrogen ions from the ion source, wherein the adjusted extraction voltage lies in a first range between a peak voltage and 30% higher than the peak voltage, the peak voltage corresponding to a peak in charge exchange efficiency for converting H3+ ions to negative hydrogen ions through charge exchange between the molecular hydrogen ions and the charge exchange species when a fraction of $H_3^+$ ions to total positive hydrogen ions is above a given threshold;
    the adjusted extraction voltage effective to generate an ion energy to maximize negative ion current yield in the charge exchange cell based upon a product of extraction efficiency of the positive molecular hydrogen ions and a peak in charge exchange efficiency for converting a species of the positive molecular hydrogen ions to negative hydrogen ions through charge exchange between the extracted hydrogen ions and charge exchange species.

2. The apparatus of claim 1, wherein the first component operative to generate a plasma comprising $H_3^+$ ions in the ion source.

3. The apparatus of claim 2, wherein the first component operative to adjust gas flow to the ion source to increase $H_3^+$ concentration.

4. The apparatus of claim 2, wherein the first component operative to adjust source power to the ion source to increase $H_3^+$ ion concentration.

5. The apparatus of claim 1, wherein the charge exchange species comprising magnesium, and the extraction voltage ranging from 20 to 40 kV.

6. The apparatus of claim 1, wherein the charge exchange species comprising cesium, $NH_3$, Xe or $H_2O$.

7. The apparatus of claim 1, wherein the second component operative to adjust extraction voltage based upon a fraction of the positive hydrogen ions that are $H_3^+$ ions.

8. A method for providing a negative hydrogen ion beam, comprising:
    generating positive molecular hydrogen ions in an ion source;
    providing a charge exchange species in a charge exchange cell, the charge exchange species operative to transform the positive hydrogen ions into negative hydrogen ions; and
    extracting the positive hydrogen molecular ions at an extraction voltage effective to maximize negative ion current yield in the charge exchange cell based upon a product of extraction efficiency of the positive molecular hydrogen ions and charge exchange efficiency for converting a species of the positive molecular hydrogen ions to negative hydrogen ions through charge exchange between the extracted hydrogen ions and charge exchange species,
    wherein the extraction voltage lies in a first range between a peak voltage and 30% higher than the peak voltage, the peak voltage corresponding to a peak in charge exchange efficiency for converting $H_3^+$ ions to negative hydrogen ions through charge exchange between the molecular hydrogen ions and the charge exchange species when a fraction of H3+ ions to total positive hydrogen ions is above a given threshold.

9. The method of claim 8, further comprising:
    determining the peak voltage; and
    setting the extraction voltage at a voltage approximately equal to the peak voltage.

10. The method of claim 8, further comprising generating a plasma comprising $H_3^+$ ions in the ion source.

11. The method of claim 8, comprising adjusting gas flow to the ion source to increase $H_3^+$ concentration.

12. The method of claim 8, comprising adjusting source power to the ion source to increase $H_3^+$ ion concentration.

13. The method of claim 8, comprising adjusting a magnetic field or electric field applied to the ion source to increase $H_3^+$ ion concentration.

14. The method of claim 8, comprising:
    providing magnesium as the charge exchange species; and
    setting the extraction voltage between 20 kV to 40 kV.

15. The method of claim 8, comprising providing cesium, $NH_3$, Xe, or $H_2O$ as the charge exchange species.

16. The method of claim 8, further comprising:
    determining a fraction of $H_3^+$ ions in the positive hydrogen ions of the ion source; and
    adjusting the extraction voltage based upon the determined fraction of $H_3^+$ ions.

17. The method of claim 16, comprising setting the extraction voltage to about 15-20 kV when the fraction of $H_2^+$ ions of total positive hydrogen ions in the ion source is above a threshold.

18. An ion implantation system to generate a proton beam, comprising:
- an ion source operative to generate a plasma and extract ions from the plasma as positive molecular hydrogen ions;
- a charge exchange cell operative to receive the positive molecular hydrogen ions and convert the extracted positive molecular hydrogen ions to negative hydrogen ions using a charge exchange species;
- an extraction voltage tuner component comprising logic operative to set an adjusted extraction voltage for extraction of the positive molecular hydrogen ions from the ion source, wherein the adjusted extraction voltage lies in a first range between a peak voltage and 30% higher than the peak voltage, the peak voltage corresponding to a peak in charge exchange efficiency for converting $H_3^+$ ions to negative hydrogen ions through charge exchange between the molecular hydrogen ions and the charge exchange species when a fraction of $H_3^+$ ions to total positive hydrogen ions is above a given threshold; and
- a tandem accelerator to convert the negative hydrogen ions into a beam of protons.

19. The ion implantation system of claim 18 wherein the adjusted extraction voltage lies in a second range between a second peak voltage and 30% higher than the second peak voltage, the second peak voltage corresponding to a peak in charge exchange efficiency for converting $H_2^+$ ions to negative hydrogen ions through charge exchange between the molecular hydrogen ions and charge exchange species when the fraction of $H_3^+$ ions to total positive hydrogen ions is below the given threshold.

20. The ion implantation system of claim 18, further comprising a hydrogen ion species tuner component is operative to adjust gas flow and/or to plasma energy and/or magnetic field and/or electric field in the ion source to increase $H_3^+$ concentration.

21. The ion implantation system claim 18, wherein the extraction voltage tuner component is operative to adjust magnetic field and/or electric field applied to the ion source to increase $H_3^+$ concentration.

22. The ion implantation system of claim 18, wherein the charge exchange species comprising magnesium, cesium, $NH_3$, Xe or $H_2O$.

23. The ion implantation system of claim 19, wherein the threshold corresponds to 50% fraction of $H_2^+$ ions to total positive hydrogen ions.

24. The ion implantation system of claim 18, wherein the charge exchange species comprises Mg, and wherein the voltage range is between 25 kV and 30 kV.

25. The ion implantation system of claim 19, wherein the charge exchange species comprises Mg, and wherein the second voltage range is between 15 kV and 20 kV.

26. The ion implantation system of claim 18, the logic to set the adjusted extraction voltage based upon a pressure of the ion source.

* * * * *